United States Patent
Ohashi et al.

(10) Patent No.: US 6,490,787 B1
(45) Date of Patent: Dec. 10, 2002

(54) METHOD AND APPARATUS FOR ALIGNING AND SUPPLYING ELECTRICAL COMPONENT

(75) Inventors: Masayoshi Ohashi, Tokyo (JP); Ryou Hashiguchi, Tokyo (JP)

(73) Assignee: Ohashi Co., Ltd., Tokyo (JP)

( * ) Notice: Subject to any disclaimer, the term of this patent is extended or adjusted under 35 U.S.C. 154(b) by 0 days.

(21) Appl. No.: 09/565,877

(22) Filed: May 5, 2000

(30) Foreign Application Priority Data

May 28, 1999 (JP) ............................................. 11-149503

(51) Int. Cl.⁷ ................................................. H05K 3/30
(52) U.S. Cl. ............................ 29/833; 29/834; 29/705; 29/712; 29/740
(58) Field of Search ..................... 29/825, 833, 705, 29/740, 712, 834

(56) References Cited

U.S. PATENT DOCUMENTS

| | | | |
|---|---|---|---|
| 4,809,430 A | * | 3/1989 | Maruyama et al. |
| 4,914,809 A | * | 4/1990 | Fukai et al. |
| 5,040,291 A | * | 8/1991 | Janisiewicz |
| 5,377,405 A | * | 1/1995 | Sakurai et al. |
| 5,420,691 A | * | 5/1995 | Kawaguchi |
| 5,787,577 A | * | 8/1998 | Kent |
| 5,903,662 A | * | 5/1999 | DeCarlo |
| 6,085,407 A | * | 7/2000 | Gamel et al. |
| 6,332,269 B1 | * | 12/2001 | Gammel et al. .............. 29/740 |

FOREIGN PATENT DOCUMENTS

| | | |
|---|---|---|
| JP | 56-40252 | 4/1981 |
| JP | 8-2888337 | 11/1996 |

OTHER PUBLICATIONS

US 6,243,943, 6/2001, Gamel et al. (withdrawn)*

* cited by examiner

*Primary Examiner*—Carl J. Arbes
(74) *Attorney, Agent, or Firm*—Flynn, Thiel, Boutell & Tanis, P.C.

(57) ABSTRACT

A method and an apparatus for aligning and supplying an electrical component capable of aligning a first electrical component to be mounted on a second electrical component relative to a suction head without using a pre-alignment stage. On supplying an IC chip being the first electrical component to a position at which the IC chip is mounted on a liquid crystal panel being the second electrical component with the suction head sucking the IC chip, after the suction head sucks the IC chip in a recessed portion in a container, the suction head is moved in an X direction and the container is moved in a Y direction to thereby cause the IC chip abut a wall of the recessed portion, and thereafter the movements in the X and Y direction are still carried out to thereby displace the suction position of the IC chip relative to the suction head to achieve the alignment thereof.

7 Claims, 7 Drawing Sheets

METHOD AND APPARATUS FOR ALIGNING AND SUPPLYING ELECTRICAL COMPONENT

TECHNICAL FIELD

The present invention relates to a method and an apparatus for aligning and supplying an electrical component for aligning an electrical component (including an electronic component) and supplying it to a position at which it is mounted on another electrical component, and is utilized, for example, in the case in which an IC (integrated circuit) chip is mounted on a liquid crystal panel with alignment marks on them being aligned with each other.

BACKGROUND ART

An operation of mounting a driver IC chip on a liquid crystal panel via a conducting material such as an ACF (anisotropic conducting film) is performed with alignment marks of the IC chip being aligned with alignment marks of the liquid crystal panel since the IC chip has to be mounted accurately at a predetermined position of the liquid crystal panel so that both of them have to be surely brought into a conductive state. To this end, an apparatus for mounting an IC chip on a liquid crystal panel is provided with a CCD camera being image pick up means for picking up the alignment marks of the IC chip and the alignment marks of the liquid crystal panel at the mounting position. The IC chip is sucked by a suction head provided at the mounting device to be supplied to the aforesaid mounting position, and in order that the alignment marks of the IC chip can be surely picked up by the CCD camera having a small possible range in which an image can be picked up, the IC chip is sucked in a state in which it is properly aligned relative to the suction head, in which state, the IC chip has to be supplied to the mounting position by movement of the suction head.

FIG. 9 to FIG. 12 show a conventional method for making the suction head suck an IC chip 81 in proper alignment. The IC chip 81 is housed in a recessed portion of a container with a bump as a conductive element facing upward, that is, in a face-up state. A suction arm not illustrated sucks the IC chip 81, and thereafter the IC chip 81 is mounted on a pre-alignment stage 82 with the suction arm as it is (FIG. 9). A pushing member 83 is disposed with a smaller space than the thickness of the IC chip 81 being provided between the pushing member 83 and the pre-alignment stage 82, and the pushing member 83 moves in two horizontal directions perpendicular to each other as shown in FIG. 10 and FIG. 11, thereby aligning the IC chip in the two horizontal directions perpendicular to each other.

The pushing member 83, which aligns the IC chip 81 with a solid line position from a two-dot line position in FIG. 12, moves in the reverse directions of the two horizontal directions perpendicular to each other to thereby retreat from the IC chip 81. The IC chip 81 is sucked by a reverse arm not illustrated, and after the arm rotates at 180 degrees in reverse and thereby the IC chip 81 is in a face-down state in which the aforesaid bump faces downward, the IC chip 81 is sucked by the suction head. The IC chip 81 in this situation is sucked by the suction head in proper alignment by the pushing action of the pushing member 83, and in the above proper alignment, the IC chip 18 is supplied to the aforesaid mounting position by movement of the suction head.

According to the above conventional method, in order that the IC chip is sucked by a suction head in proper alignment, a step is necessary, in which the IC chip is once placed on the pre-alignment stage, and this causes the disadvantage of increasing operating time. Further, the apparatus for mounting the IC chip on the liquid crystal panel has to be provided with a component and means such as a pre-alignment stage and suction arm other than the suction head, and as the result, the disadvantages of the configuration being complicated and the entire apparatus increasing in size.

An object of the present invention is to provide a method for aligning and supplying an electrical component, capable of performing an operation of mounting the first electrical component such as an IC chip on the second electrical component such as a liquid crystal panel with a step using a pre-alignment stage being omitted, and thereby reducing the operating time.

Another object of the present invention is to provide an apparatus for aligning and supplying an electrical component which eliminates a need of members and means related to the step using the pre-alignment stage, thereby making it possible to simplify the configuration and reduce the entire apparatus in size.

DISCLOSURE OF THE INVENTION

The present invention is made in view of the fact that the container housing a first electrical component such as an IC chip in a recessed portion is formed with comparatively high precision.

A method for aligning and supplying an electrical component according to the present invention is characterized by including the steps of sucking a first electrical component housed in a recessed portion of a container with a suction head, and thereafter causing relative movement between the container and the suction head, thereby causing the first electrical component to abut a wall of the recessed portion; carrying out the relative movement after abutting, and thereby displacing the first electrical component relative to the suction head and changing a suction position; and supplying the first electrical component, which is in proper alignment as a result of the change, to a mounting position at which the first electrical component is mounted on a second electrical component by movement of the suction head.

Further, an apparatus for aligning and supplying an electrical component according to the present invention is an apparatus for aligning and supplying the electrical component for aligning the first electrical component and supplying the same to a mounting position at which the first electrical component is mounted on a second electrical component, and is characterized by including a suction head for sucking the first electrical component housed in a recessed portion of a container and supplying the first electrical component to the aforesaid mounting position; and aligning drive means which moves at least one of the suction head and the container to cause the first electrical component sucked by the suction head to abut a wall of the recessed portion, and after abutting, carries out the aforesaid movement to thereby displace the suction position of the first electrical component relative to the suction head to achieve alignment of the first electrical component.

In the present invention described above, even after the first electrical component sucked by the suction head abuts the wall of the recessed portion of the container housing the first electrical component, the relative movement between the suction head and the container is further carried out, thereby causing a displacement of the first electrical component relative to the suction head, and thus the first electrical component is aligned relative to the suction head.

Consequently, according to the present invention, the step using a pre-alignment stage can be eliminated, thus making it possible to reduce operating time. Further, since the members and means related to the step with the pre-alignment stage are not needed, the configuration of the entire apparatus can be simplified and the entire apparatus can be reduced in size.

In the present invention, when the alignment of the first electrical component sucked by the suction head may be carried out in only one of the X and Y direction of the aforesaid recessed portion of which opening shape is two-dimensional in the X and Y direction perpendicular to each other of the container housing the first electrical component, for example, due to the shape or the like of the conductive element of the second electrical component on which the first electrical component is mounted, it is suitable if the aforesaid relative movement of the aforesaid method and the aforesaid aligning drive means of the aforesaid apparatus according to the present invention can carry out the alignment in one of these directions.

However, when the alignment of the first electrical component sucked by the suction head is required in both of the X and Y direction, the aforesaid relative movement of the aforesaid method and the aforesaid aligning drive means of the aforesaid apparatus according to the present invention shall be able to carry out alignment in both of the directions.

When the alignment in both of the X and Y direction is made possible, the aforesaid aligning drive means of the aforesaid apparatus according to the present invention may be the means capable of carrying out alignment in both of the X and Y direction only by the movement of the suction head or only by the movement of the container, but it is preferable that the aligning drive means has the X direction drive means for moving the suction head in the X direction, and the Y direction drive means for moving the container in the Y direction.

When the aligning drive means is configured as above, since the suction head originally has to reciprocate between the position at which the container is disposed and the aforesaid mounting position, this reciprocating means can be also used as the X direction drive means for aligning the first electrical component in the X direction just as it is. Further, a plurality of recessed portions for housing a plurality of the first electrical components are formed in the container and in order to remove the first electrical components from a plurality of recessed portions provided side by side in the Y direction, drive means for moving the container in the Y direction is needed, and thus the drive means can be also used as the Y direction drive means for aligning the first electrical component in the Y direction just as it is.

The aligning drive means, the X direction drive means, and the Y direction drive means may be means by a servo motor or by a cylinder, and it can be selected at will.

At the aforesaid mounting position, when the first electrical component is to be mounted on the second electrical component with the alignment marks provided on the first and second electrical components being aligned with each other, the aforesaid apparatus according to the present invention may be provided with image pick up means for picking up alignment marks provided respectively on the first electrical component and the second electrical component at the aforesaid mounting position, and positioning means for positioning the position of the second electrical component so that the alignment marks of the second electrical component which are picked up by the image pick up means are aligned with the alignment marks of the first electrical component.

The image pick up means may be a CCD camera, or may be an ordinary optical camera. Further, the positioning means may be a manual one using a micrometer or the like operated by an operator, or may be an automatic one using a servo motor or the like.

The present invention is applicable for mounting an arbitrary first electrical component on an arbitrary second electrical component. As for the first electrical component, for example, an IC chip, a transistor, a diode, or condenser may be applicable. As for the second component, for example, a liquid crystal panel, or rigid of flexible substrate may be applicable.

Further, in the aforesaid method according to the present invention and the aforesaid apparatus according to the present invention, the suction means of the aforesaid suction head for sucking the first electrical component may be the one by the sucking of air, and if the first electrical component is formed of a magnetic substance or has a magnetic substance, means by magnetic may be suitable.

BEST MODE FOR CARRYING OUT THE INVENTION

In order to describe the present invention in more detail, the explanation thereof will be made with reference to the attached drawings.

This embodiment is applied to the case in which an IC chip being a first electrical component is mounted on a liquid crystal panel being a second electrical component.

Figure 1:
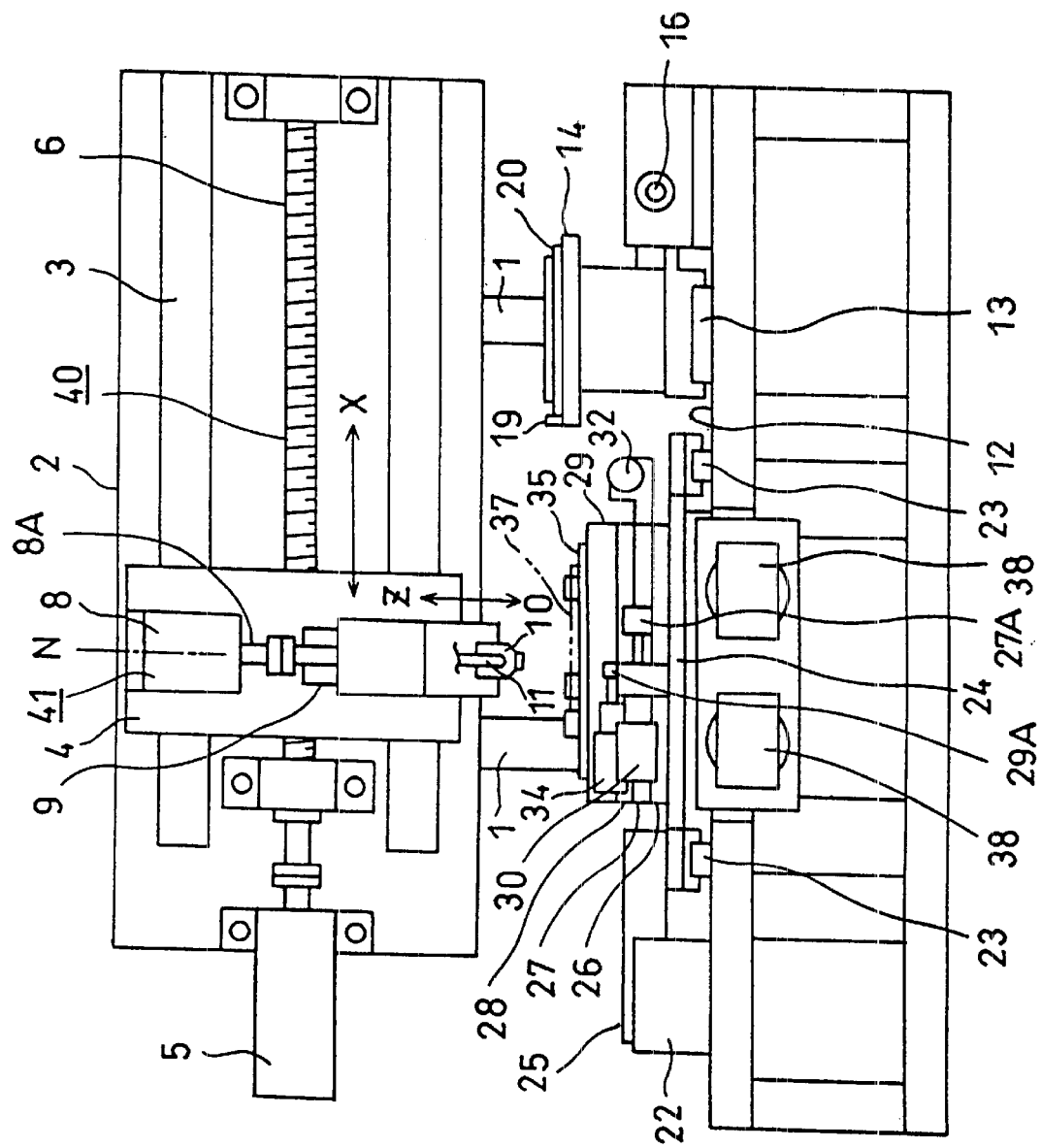
FIG. 1 is a front view showing an apparatus according to an embodiment of the present invention.

In FIG. 1, a vertical plate member 2 supported by a bearing member 1 is provided at the rear of an apparatus according to this embodiment, and a slide 4 guided by a guide rail 3 to be slidable in a left and right direction (X direction) is disposed at this vertical plate member 2. The slide 4 is connected to a ball screw 6 rotated by a servo motor 5 via a connecting member 7 in FIG. 3, and the connecting member 7 has a nut member which screws into the ball screw 6, thus moving the slide 4 in the X direction by normal and reverse rotation of the servo motor 5. As shown in FIG. 1, a cylinder 8 with a piston rod 8A facing downwards is mounted to the slide 4, and a suction head 10, which is guided by a guide rail 9 to be slidable in a vertical direction (Z direction), is coupled to the foremost end of the piston rod 8A. The suction head 10 moves in the Z direction by means of the cylinder 8.

A pipe line 11 extending from suction means consisting of a vacuum pump and the like is connected to the suction head 10, and thereby, the suction head 10 has an action to suck articles.

Figure 2:
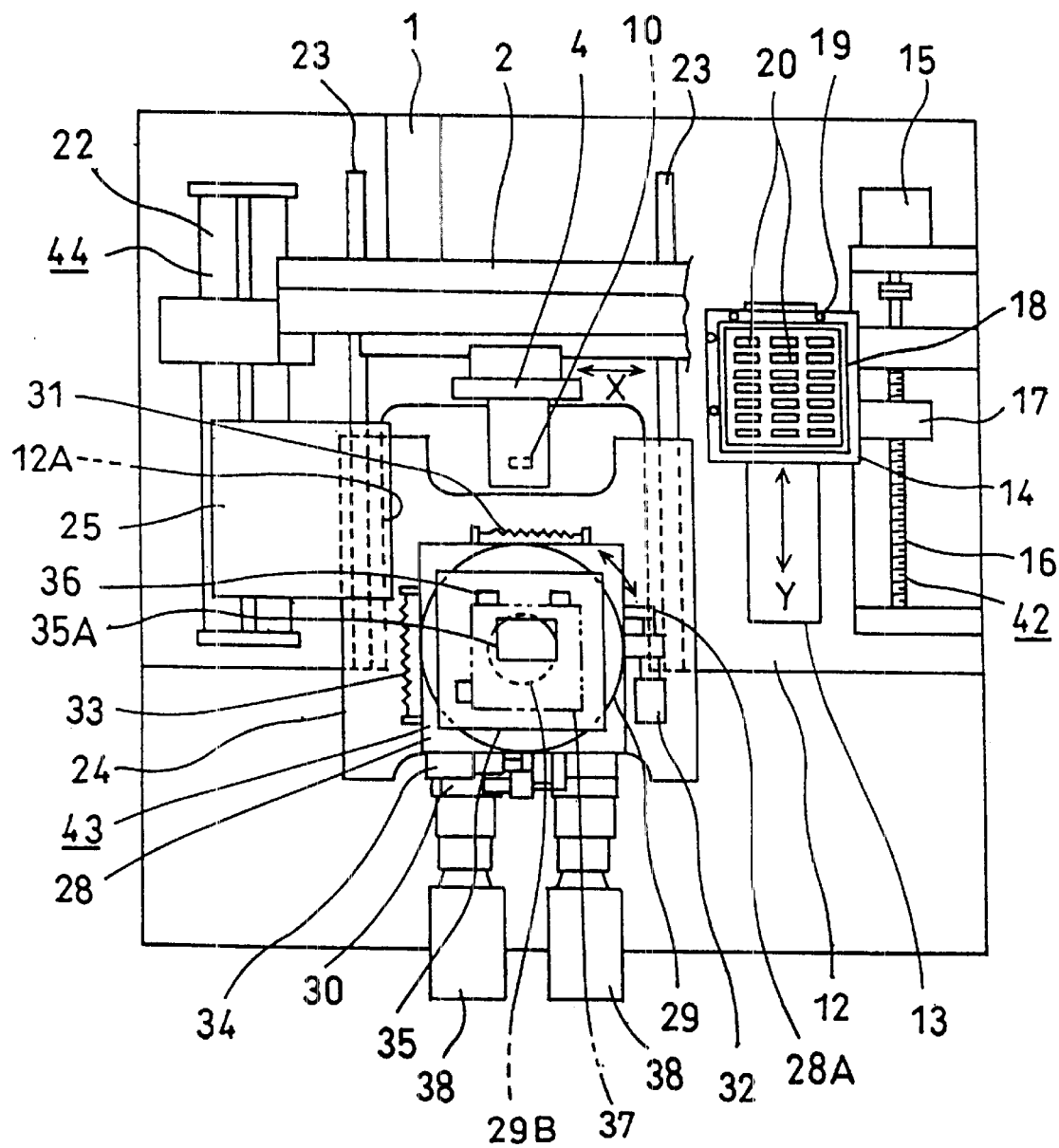
FIG. 2 is a partially cutaway plan view of the same apparatus.

At the lower part of the vertical plate member 2 configured as above, a horizontal stage section 12 is provided as shown in FIG. 1, and on the upper right surface of the horizontal stage section 12, a container carrying member 14, which is guided by a guide rail 13 shown in FIG. 2 to be slidable in a longitudinal direction (Y direction) perpendicular to the Y and Z direction, is disposed. The container carrying member 14 is connected to a ball screw 16 rotated by a servo motor 15 via a connecting member 17, and the connecting member 17 has a nut member for screwing into the ball screw 16, thus moving the container carrying member 14 in the Y direction by the normal and reverse rotation of the servo motor 15.

A container 18 with IC chips therein is positioned by a positioning member 19 to be placed on the container carrying member 14, and an IC chip 21 is housed in each of a plurality of recessed portions 20 placed side by side in both the X and Y direction in this container 18 (See FIG. 4 to FIG. 7).

As shown in FIG. 2, on an upper left surface of the aforesaid horizontal stage section 12, a rodless cylinder 22 is placed, and a slide 24, which is guided by a pair of guide rails 23 to be slidable in the Y direction, is connected to the rodless cylinder 22 via a connecting member 25. As shown in FIG. 1, a base stand 26 is fixed on the slide 24, and an X table 27, a Y table 28, and a rotary table 29 are placed on the base stand 26 in order. The X table 27 is movable in the X direction by the guide rail with respect to the base stand 26, the Y table 28 is movable in the Y direction by the guide rail with respect to the X table 27, and the rotary table 29 is rotatable around the vertical axis by a rotary bearing with respect to the Y table 28.

A micrometer 30 shown in FIG. 1 is mounted to the base stand 26, and since a spindle of the micrometer 30 abuts a projection 27A provided to project from the X table 27, if an operator performs an operation of normally rotating the micrometer 30, the X table 27 is moved forward in the X direction by the spindle of the micrometer 30, which rotates normally to move forward. Since a return spring 31 shown in FIG. 2 is provided between the base stand 26 and the X table 27, if the operator performs an operation of reversely rotating the micrometer 30, the X table 27 retreats in the X direction. A micrometer 32 shown in FIG. 1 is mounted to the X table 27, and since a spindle of the micrometer 32 abuts a projection 28A in FIG. 2, which is provided to project from the Y table 28, if the operator performs an operation of normally rotating the micrometer 32, the Y table 28 is moved forward in the Y direction by the spindle of the micrometer 30, which rotates normally to move forward. Since a return spring 33 shown in FIG. 2 is provided between the X table 27 and the Y table 28, if the operator performs an operation of reversely rotating the micrometer 32, the Y table 28 retreats in the Y direction.

Further, a micrometer 34 shown in FIG. 1 is mounted to the Y table 28, and since a spindle of the micrometer 34 abuts a projection 29A provided to project from the rotary table 29, if the operator performs an operation of normally rotating the micrometer 34, the rotary table 29 is normally rotated by the spindle of the micrometer 34, which rotates normally to move forward. Since a return spring not shown is provided between the Y table 28 and the rotary table 29, if the operator performs an operation of reversely rotating the micrometer 34, the rotary table 29 is reversely rotated.

As shown in FIG. 2, a liquid crystal panel carrying plate 35 is fixed on the rotary table 29, and a liquid crystal panel 37 is positioned by a positioning member 36 to be mounted on the liquid crystal panel carrying plate 35. A suction port not shown, which is connected to suction means consisting of a vacuum pump and the like, is formed at the liquid crystal panel carrying plate 35, and the liquid crystal panel 37 placed on the liquid crystal panel carrying plate 35 is fixed on the carrying plate 35 by the suction activity of the suction port.

Figure 3:
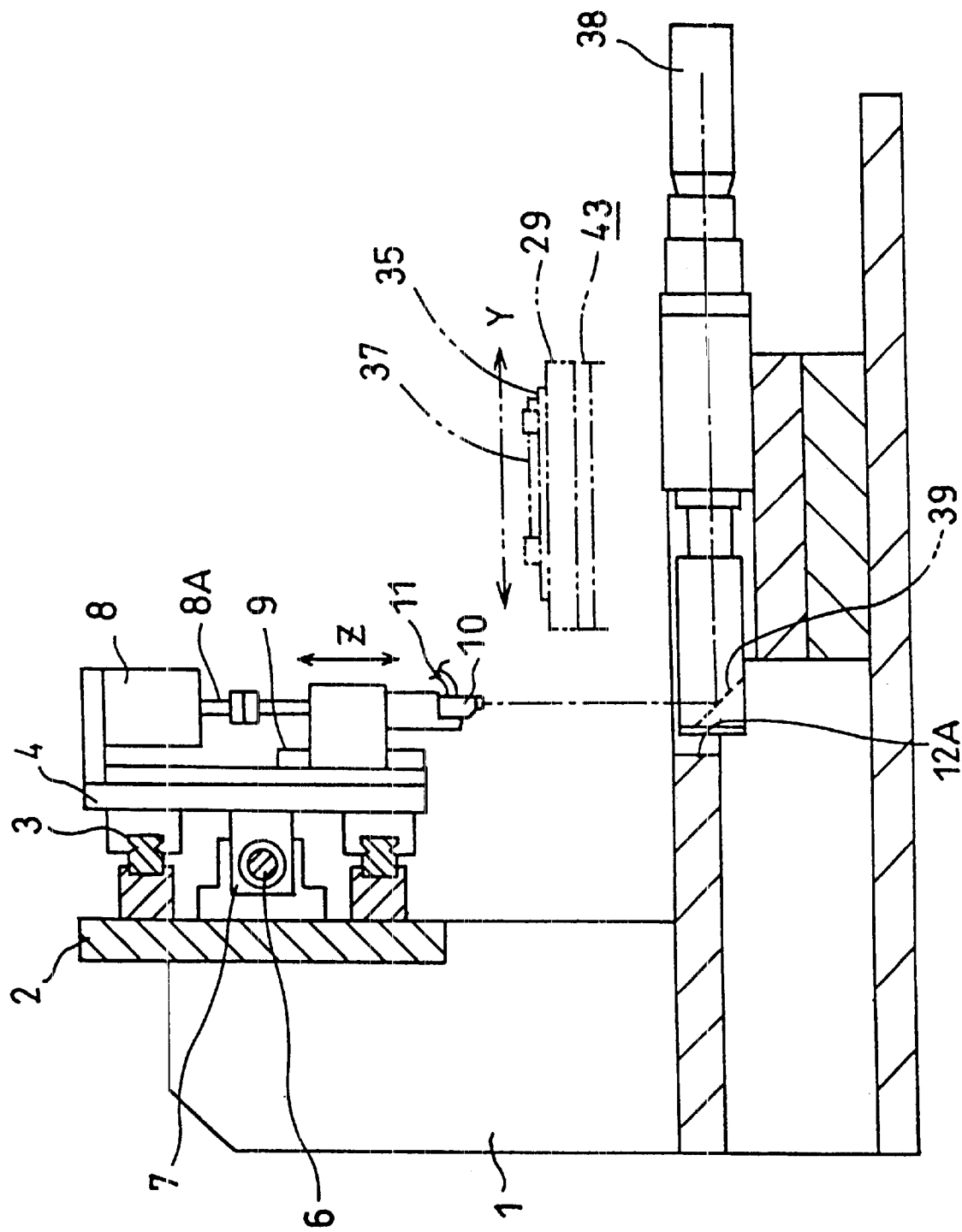
FIG. 3 is a sectional side view of the same apparatus.

Two of CCD cameras 38 being image pickup means are fixedly placed at a forward side between the aforesaid container mounting member 14 and the aforesaid rodless cylinder 22 shown in FIG. 2. These CCD cameras 38 are each placed to aligned with a recessed portion 12A which is formed to be recessed toward the front in the center portion of the aforesaid horizontal stand section 12, and a reflecting mirror 39 shown in FIG. 3 is disposed at the front of the CCD camera 38. As a result, an image just above the reflecting mirror 39 can be picked up by means of the CCD camera 38 via the reflecting mirror 39.

Figure 8:
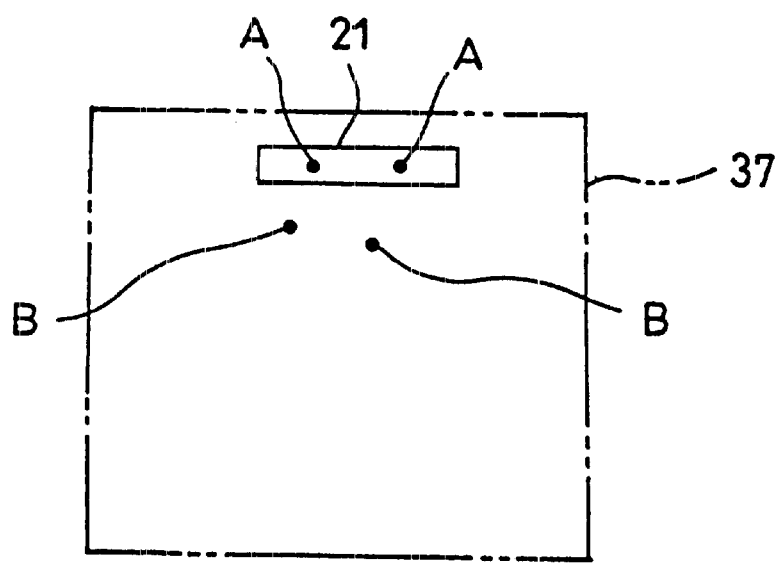
FIG. 8 is a view showing an operation of aligning alignment marks of the IC chip with alignment marks of a liquid crystal panel being a second electrical component.
Figure 9:
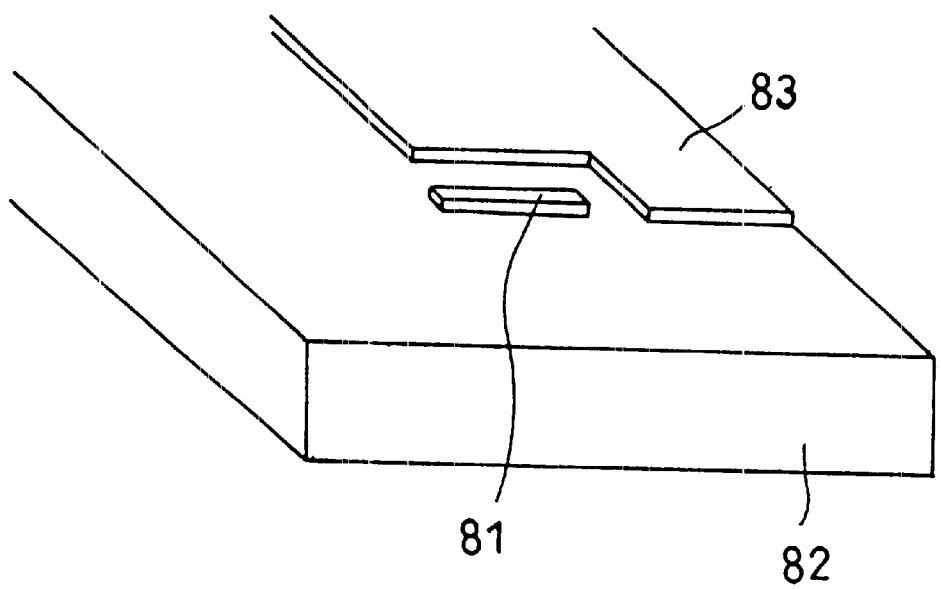
FIG. 9 is a view for explaining a conventional method of alignment with use of a pre-alignment stage, and is a perspective view showing an initial state.
Figure 10:
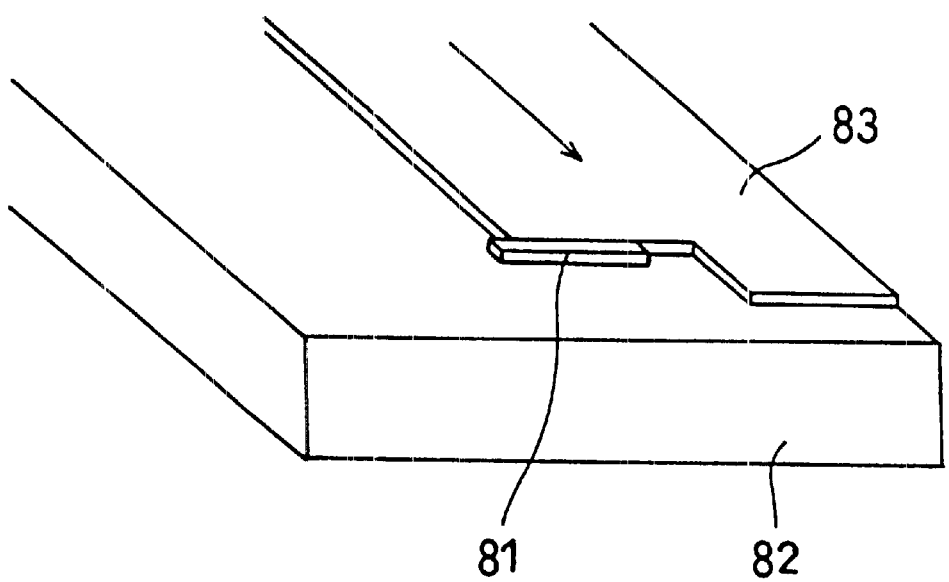
FIG. 10 is the same view, and is a perspective view showing a second state.
Figure 11:
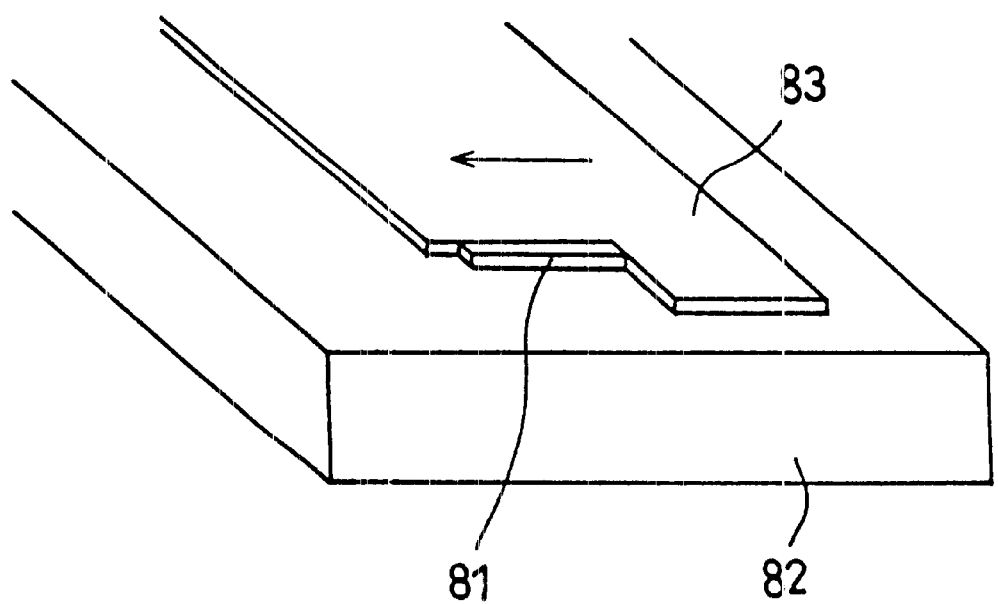
FIG. 11 is the same view, and is a perspective view showing a third state.
Figure 12:
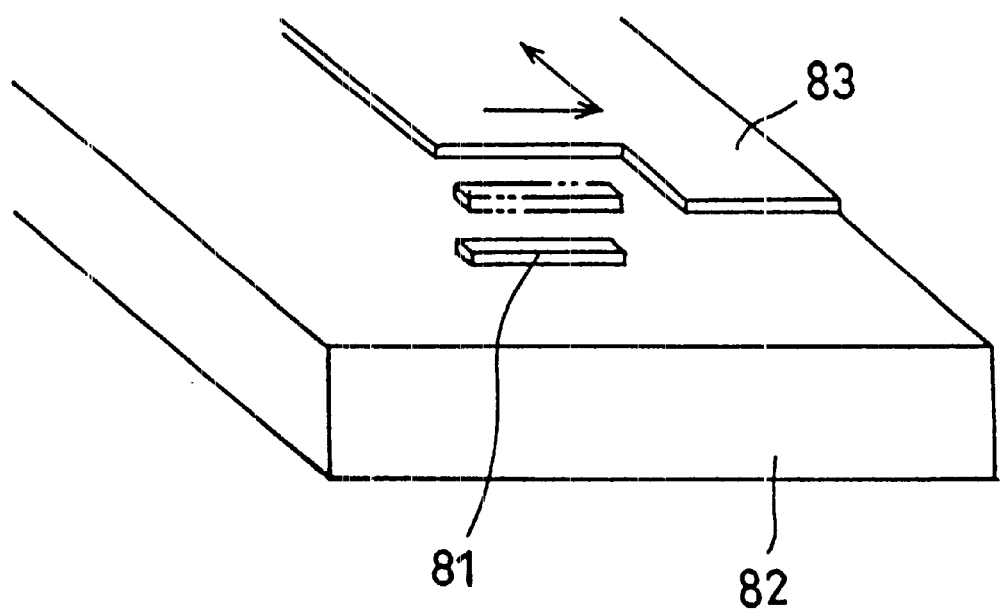
FIG. 12 is the same view, and is a perspective view showing a fourth state.

The left end position of the moving range of the suction head 10, which moves in the X direction by the servo motor 5 shown in FIG. 1, is a motion starting point N of the suction head 10, and the setting is made so that two alignment micrometers A (See FIG. 8) provided at the IC chip 21 are within the small possible image-pickup range (for example, 0.3 square millimeters) of the two CCD cameras 38 when the aforesaid IC chip 21 is previously aligned properly (pre-alignment) and sucked by the suction head 10 which has returned to the motion starting point N.

In the above, X direction driving means 40 shown in FIG. 1, which is for moving the suction head 10 in the X direction, consists of the servo motor 5, the ball screw 6 and the like, and Z direction driving means 41 shown in FIG. 1, which is for moving the suction head 10 in the Z direction, consists of the cylinder 8 and the like. Further, Y direction driving means 42 shown in FIG. 2, which is for moving the container 18 holding the IC chips in the Y direction, consists of the aforesaid servo motor 15, the ball screw 16 and the like.

Furthermore, a positioning stage 43 shown in FIG. 2, which is for adjusting the position of the liquid crystal panel 37 in the X direction, Y direction, and the rotational direction around the vertical axis, consists of the slide 24, the base stand 26, the X table 27, the Y table 28, and the rotary table 29. The positioning stage 43 being positioning means is movable in the Y direction by forward and reverse motion drive means 44 consisting of the rodless cylinder 22 shown in FIG. 2 and the like, and when moving forward, the positioning stage 43 reaches a position just above the aforesaid reflecting mirror 39.

Openings are formed in the slide 24, the base stand 26, the X table 27, and the Y table 28, and the rotary table 29, which constitute the positioning stage 43, placed vertically on one another, (An opening 29B of the rotary table 29 is shown in FIG. 2), and an opening 35A aligned with the above openings is formed in the liquid crystal panel carrying plate 35 on the rotary table 29. As a result, when the positioning stage 43 reaches the position of forward motion by the forward and reverse motion drive means 44, two alignment marks B (See FIG. 8) of the liquid crystal panel 37 placed on the liquid crystal panel carrying plate 35 can be picked up by the CCD cameras 38.

Next, the operation of mounting the IC chip 21 on the liquid crystal panel 37 with the above alignment marks A and B being aligned with each other will be explained. The operation of the apparatus according to the present embodiment in the below will be performed following the procedure steps previously set by control means by a computer in which various kinds of data including each measurement of the container 18 and the recessed portion 20 are recorded.

Figure 4:
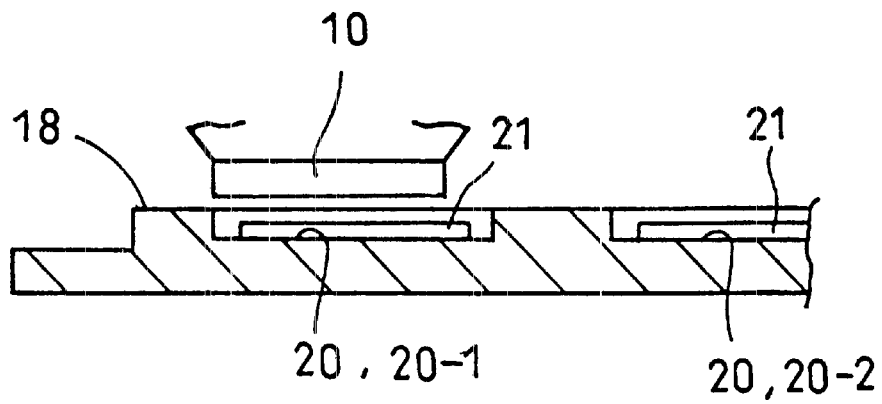
FIG. 4 is a partially enlarged sectional front view of a container, showing a situation just before a suction head sucks an IC chip being a first electrical component in a recessed portion of the container.

On turning on a operation starting switch not illustrated, the suction head 10 at the motion starting point N is moved rightward in FIG. 1 by the driving force of the aforesaid X direction drive means 40, and thereafter, the suction head 10 is descended to a fixed position by the Z direction drive means 41. The position to which the suction head 10 is descended is a little above the top surface of the container 18 with the IC chips 21 therein as shown in FIG. 4. The position in the X direction, which the suction head 10 reaches at this time, is at the position of a recessed portion 20-1, which is the nearest to the motion starting point N, of the recessed portions 20 in the front row out of a plurality of recessed portions 20 respectively housing the IC chips 21 as shown by the two-dot chain line in FIG. 7, but the suction head 10 does not reach the position accurately aligned with the center of the recessed portion 20-1 which is formed to be in a two-dimensional opening shape having both directions X and Y, and the suction head 10 reaches the position a little displaced in both of the directions X and Y from the center of the recessed portion 20-1.

Figure 5:
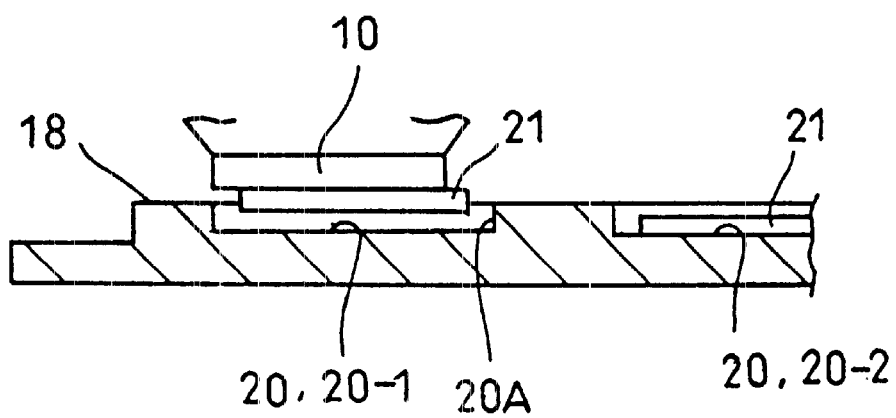
FIG. 5 is a partially enlarged sectional front view of the container, showing a situation after the IC chip is sucked by the suction head.
Figure 6:
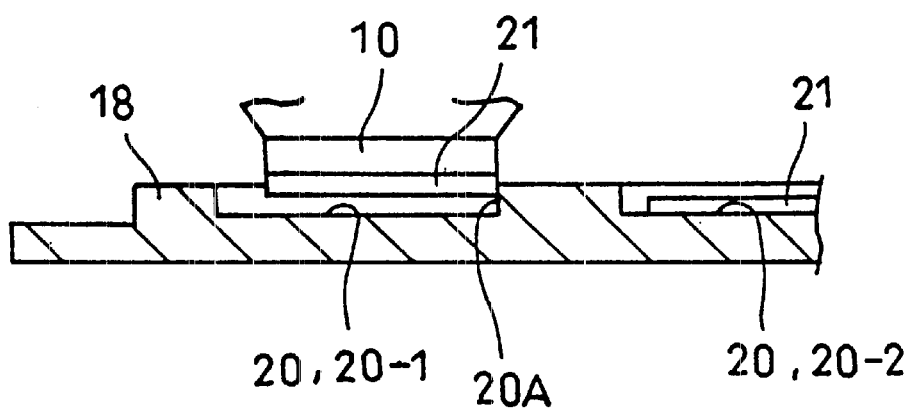
FIG. 6 is a partially enlarged sectional front view of the container, showing a situation in which the IC chip is aligned in an X direction relative to the suction head.

When the suction head 10 is descended to the position shown in FIG. 4, the aforesaid suction means, which is connected to the suction head 10, drives, and as a result, the IC chip 21, which is housed in the recessed portion 20-1 with the bump previously facing downward, is sucked by the suction head 10 as shown in FIG. 5 and is moved away from the bottom of the recessed portion 20-1. Thereafter, the X direction drive means 40 moves the suction head 10 rightward in FIG. 5, thereby causing the IC chip 21 to abut a side wall 20A of the recessed portion 20-1. Even after abutting as above, the X direction drive means 40 moves the suction head 10 in the same direction, with the suction head 10 keeping sucking the IC chip 21, thereby causing a displacement in the X direction between the suction head 10 and the IC chip 21, and a change in the position at which the suction head 10 sucks the IC chip 21 is made. The displacement between the suction head 10 and the IC chip 21 caused by the X direction drive means 40 is made until the suction head 10 and the IC chip 21 have predetermined positional relationship, that is, until the center of the IC chip 21 in the X direction and the center of the suction head 10 in the X direction are aligned with each in the present embodiment shown in FIG. 6.

With these centers being aligned with each other, the alignment of the IC chip 21 with the suction head 10 in the X direction is achieved.

Figure 7:
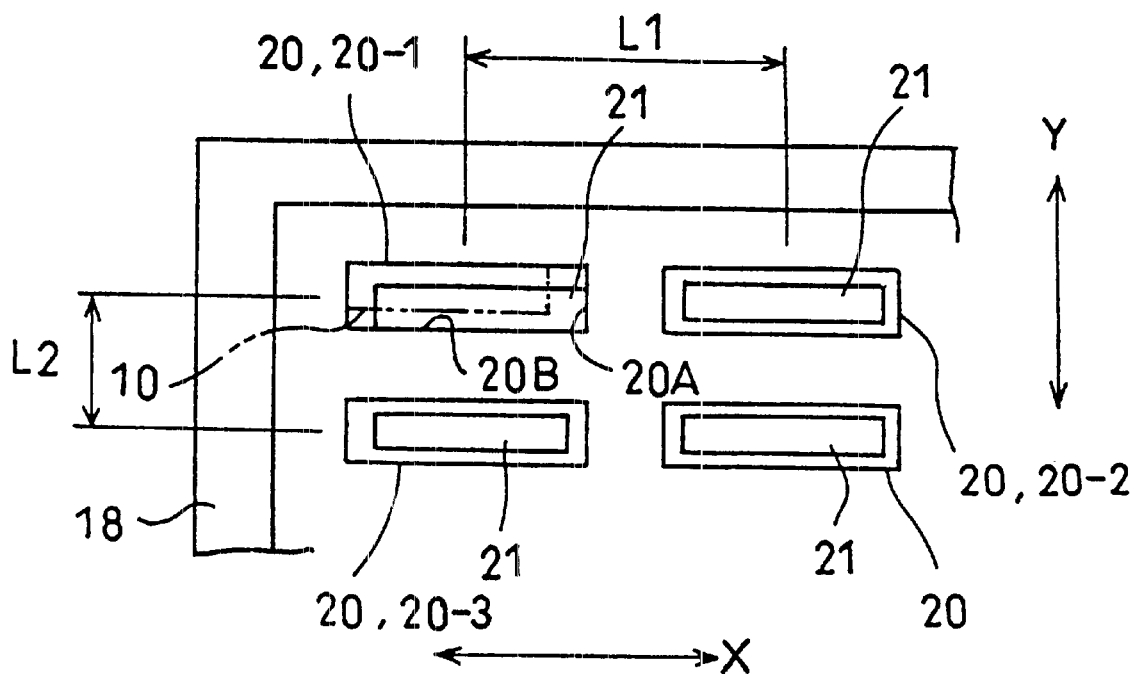
FIG. 7 is a partially enlarged plan view of the container, showing a situation in which the IC chip is aligned in both of the X direction and a Y direction.

Subsequently, the X direction drive means 42 moves the container 18 to the upper side (forward) in the Y direction in FIG. 2, thereby causing the IC chip 21 to abut a rear wall 20B of the recessed portion 20 shown in FIG. 7, and after abutting as above, the Y direction drive means 42 drives. Thereby, a displacement in the Y direction between the suction head 10 and the IC chip 21 is caused, and the displacement is caused until the suction head 10 and the IC chip 21 have predetermined positional relationship. As a result, the IC chip 21 is also aligned with the suction head 10 in the Y direction. FIG. 7 shows the IC chip 21 in this situation.

Thereafter, the suction head 10 is ascended by the drive of the Z direction drive means 41, and the suction head 10 is returned to the motion starting point N while sucking the IC chip 21, in other words, the suction head 10 is returned to the position in which the IC chip 21 is mounted on the aforesaid liquid crystal panel 37. During this interval, the container 18 is returned to the position at which it stayed before the aforesaid alignment in the Y direction by the reverse drive of the Y direction drive means 42.

The suction head 10 is descended by the drive of the Z direction drive means 41 at the motion starting point N, and the descend is stopped when the suction head 10 reaches the position with the height at which the alignment marks A of the IC chip 21 sucked by the suction head 10 can be picked up by the aforesaid CCD camera 38. Thereafter, the alignment marks A are picked up by the CCD camera 38 as in FIG. 8, and the marks A are displayed on an image display device not illustrated and are recorded in the image display device as they are. Subsequently, the suction head 10 is ascended up to a predetermined position by the Z direction drive means 41.

Thereafter, on turning on a switch not illustrated, the aforesaid positioning stage 43 with the aforesaid liquid crystal panel carrying plate 35 on which the liquid crystal panel 37 is previously placed is moved forward by the forward and reverse motion drive means 44, and reaches the position in which the alignment marks B of the liquid crystal panel 37 can be picked up by the CCD camera 38. The height of the liquid crystal panel 37 in this situation is the same as that when the alignment marks A of the IC chip 21 are picked up by the CCD camera 38. The alignment marks B of the liquid crystal panel 37 are photographed by the CCD camera 38 as in FIG. 8 and the marks B are displayed on the aforesaid image display device.

While watching the image display device, the operator performs an operation of rotating the aforesaid micrometers 30, 32 and 34 provided at the positioning stage 43, thereby slightly moving the liquid crystal panel 37 in the X and Y direction and the rotational direction around the vertical axis to perform an operation of aligning the alignment marks A of the IC chip 21 with the alignment marks B of the liquid crystal panel 37. Though the liquid crystal panel 37 is placed on the liquid crystal panel carrying plate 35, being positioned by the aforesaid positioning member 36, the outer shape of the liquid crystal panel 37 is not precise, but has an error. Consequently, the liquid crystal panel 37 positioned by the positioning member 36 based on this outer shape is not placed on the liquid crystal panel carrying plate 35 in accurate alignment, and therefore the alignment marks A and B are aligned by the operation of rotating the micrometers 30, 32 and 34 as above.

Thereafter, the suction head 10 is descended by the Z direction drive means 41, and thereby the IC chip 21 sucked by the suction head 10 is pressed against an ACF previously adhered to a predetermined position of the liquid crystal panel 37. Subsequently, the suction head 10, with the suction activity by the aforesaid suction means being released, is ascended by the Z direction drive means 41, and as a result, the IC chip 21 adhered to the ACF is left on the liquid crystal panel 37. When the suction head 10 is ascended after pressing the IC chip 21 against the ACF of the liquid crystal panel 37, the positioning stage 43 is returned to the original retreat position by the reverse drive of the forward and reverse motion drive means 44, and at this retreat position, the operator removes the liquid crystal panel 37 from the positioning stage 43. The liquid crystal panel 37 is sent to a unit for heating and compressing the IC chip 21, where the IC chip 21 is heated and compressed against the liquid crystal panel 37, thereby connecting conductive particles in the ACF to each other, and the IC chip 21 and the liquid crystal panel 37 in accurate alignment with the alignment marks A and B being aligned with each other are surely brought into electrical conduction.

Thus an operation of mounting the first IC chip 21 held in the container 18 on the liquid crystal panel 37 is completed.

Thereafter, by repeating the same operation, each IC chip 21 held in the container 18 is mounted on the liquid crystal panel 37 in order, and when the suction head 10 sucks the IC chip 21 housed in a recessed portion 20-2 which is the second nearest one to the motion starting point N out of the recessed portions 20 in the front row of the container 18 shown in FIG. 7, the moving distance of the suction head 10 from the motion starting point N by the X direction drive means 40 is what is made by adding an X direction interval L1 between the recessed portions 20 to the moving distance of the suction head 10 which sucks the aforesaid first IC chip 21. When the suction head 10 sucks the IC chip 21 housed in a recessed portion 20-3 in the second row of the container 18, the container 18 is moved forward by a Y direction interval L2 between the recessed portions 20 by the aforesaid Y direction drive means 42, and thereafter the suction head 10 sucks the IC chip 21.

According to the present embodiment explained thus far, the operation of aligning the IC chip 21 relative to the suction head 10, which is necessary before the IC chip 21 is mounted on the liquid crystal panel 37, is performed by causing a relative movement in the X and Y direction between the suction head 10 and the container 18 even after the IC chip 21 sucked by the suction head 10 abuts the walls 20A and 20B of the recessed portion 20 of the container 18 housing the IC chip 21, and thereby displacing the suction position of the IC chip 21 relative 10 the suction head 1, and thus the process step of using the conventional pre-alignment stage is not required, thereby reducing operating time and increasing operability. In addition, the members and means related to the process step with the pre-alignment stage is not needed, thus simplifying the configuration of the entire apparatus and reducing the apparatus in size.

Further, even if each of the IC chips 21 is housed in any given position in the recessed portion 20 in the container 18 at random, relative movements in the X and Y direction are caused between the suction head 10 sucking the IC chip 21 and the container 18 to displace the suction position of the IC chip 21 relative to the suction head 10, thereby making it possible to accurately align the IC chip 21 relative to the suction head 10.

Furthermore, the suction head 10 is moved in the X direction relative to the container 18 for aligning the IC chip 21 relative to the suction head 10 by utilizing the X direction drive means 40 which is originally necessary to supply the IC chip 21 to the mounting position to the liquid crystal panel 37 from the position of the container 18, and in addition, the container 18 is moved in the Y direction relative to the suction head 10 for alignment of the IC chip 21 by utilizing the Y direction drive means 42 which is originally necessary to take out the IC chips 21 by means of the suction head 10 from the respective recessed portions 20 provided side by side in the Y direction of the container 18. Therefore, the X direction drive means 40 and the Y direction drive means 42 can be used as alignment drive means for aligning the IC chip 21, and special alignment drive means is not necessary, thus making it possible to simplify the configuration and reduce the entire apparatus in size in this point.

INDUSTRIAL AVAILABILITY

As explained thus far, a method and apparatus for aligning and supplying an electrical component according to the present invention is applicable to be used in an operation of mounting a first electrical component such as an IC chip on a second electrical component such as a liquid crystal panel in accurate alignment.

What is claimed is:

1. An apparatus for aligning and supplying a first electrical component to a mounting position at which the first electrical component is mounted onto a second electrical component, said apparatus comprising:
    a suction head for holding the first electrical component housed in a recessed portion of a container and supplying the first electrical component to the mounting position, said recessed portion being formed to have a two-dimensional opening in X and Y directions, the X and Y directions being perpendicular to each other; and
    aligning drive means for moving at least one of said suction head and said container to cause the first electrical component held by said suction head to abut a wall of said recessed portion and, after the first electrical component abuts the wall, continuing the movement to cause a relative displacement between the suction head and the first electrical component to achieve alignment of the first electrical component, said aligning drive means comprising X-direction drive means for moving said suction head in the X direction and Y direction drive means for moving said container in the Y direction.

2. The apparatus for aligning and supplying the electrical component according to claim 1,
    wherein the first electrical component comprises an IC chip and the second electrical component comprises a liquid crystal panel.

3. The apparatus for aligning and supplying the electrical component according to claim 1, further comprising:
    image pick up means for detecting alignment marks provided respectively on the first electrical component and the second electrical component at the mounting position; and
    positioning means for positioning the second electrical component so that the alignment marks of the second electrical component picked up by the image pick up means are aligned with the alignment marks of the first electrical component.

4. The apparatus for aligning and supplying the electrical component according to claim 3,
    wherein the first electrical component comprises an IC chip and the second electrical component comprises a liquid crystal panel.

5. A method for aligning and supplying a first electrical component to a mounting position at which the first electrical component is mounted onto a second electrical component, said method comprising the steps of:

proveding a container having a recessed portion housing the first electrical component, said recessed portion being formed to have a two-dimensional opening in X and Y directions, the X and Y directions being perpendicular to each other;

contacting and holding the first electrical component with a suction head;

causing relative movement between said suction head and said container to cause the first electrical component to abut a wall of the recessed portion;

continuing the relative movement between said suction head and said first container to cause relative displacement between the first electrical component and the suction head and cause an alignment of the first electrical component; and supplying the first electrical component to the mounting position at which the first electrical component is mounted on the second electrical component by movement of the suction head by moving at least one of the suction head in the X direction and the container in the Y direction.

6. The method of claim 5, wherein the first electrical component comprises an IC chip and the second electrical component comprises a liquid crystal panel.

7. The method of claim 5, additionally comprising the steps of:

providing image pick up means for detecting alignment marks provided respectively on the first electrical component and the second electrical component; and positioning the first and second electrical components in a manner such that their alignment marks are in alignment with each other at the mounting position.

* * * * *